(12) United States Patent
Cho et al.

(10) Patent No.: US 9,543,183 B2
(45) Date of Patent: Jan. 10, 2017

(54) HEATED ELECTROSTATIC CHUCK AND SEMICONDUCTOR WAFER HEATER AND METHODS FOR MANUFACTURING SAME

(71) Applicant: FM INDUSTRIES, INC., Fremont, CA (US)

(72) Inventors: Jae Yong Cho, Fishkill, NY (US); Kevin Argabright, Richardson, TX (US); James E. LaRoche, III, Rhinebeck, NY (US); Mahmood Naim, Salt Point, NY (US); David R. Hammerich, Chandler, AZ (US); John R. Miller, Wappingers Falls, NY (US)

(73) Assignee: FM Industries, Inc., Fremont, CA (US)

( * ) Notice: Subject to any disclaimer, the term of this patent is extended or adjusted under 35 U.S.C. 154(b) by 601 days.

(21) Appl. No.: 14/038,039

(22) Filed: Sep. 26, 2013

(65) Prior Publication Data

US 2014/0291311 A1 Oct. 2, 2014

Related U.S. Application Data

(60) Provisional application No. 61/807,002, filed on Apr. 1, 2013.

(51) Int. Cl.
*H05B 11/00* (2006.01)
*H01L 21/683* (2006.01)
*H01L 21/67* (2006.01)

(52) U.S. Cl.
CPC ..... *H01L 21/6833* (2013.01); *H01L 21/67103* (2013.01); *Y10T 29/49083* (2015.01)

(58) Field of Classification Search
CPC ............... H01L 21/683; H01L 21/6833; H01L 21/67103; H01L 21/3065; H05B 3/02; H05B 3/10; H05B 3/26; H05B 3/54; H05B 3/68; H05B 11/00
(Continued)

(56) References Cited

U.S. PATENT DOCUMENTS 5,700,987 A * 12/1997 Basavanhally ...... G02B 6/4225
219/209
6,268,994 B1 7/2001 Logan et al.
(Continued)

FOREIGN PATENT DOCUMENTS

JP 05-082528 A 4/1993
JP 2009-283700 A 12/2009
(Continued)

OTHER PUBLICATIONS

Written Opinion of the International Preliminary Examining Authority, International Application No. PCT/US2014/016395, dated Feb. 10, 2015 (10 pages).
(Continued)

*Primary Examiner* — Brian Jennison
(74) *Attorney, Agent, or Firm* — Burr & Brown, PLLC

(57) ABSTRACT

A heated electrostatic chuck is provided, including a base having an upper surface and peripheral side surfaces, a thermal barrier coating formed by plasma deposition directly on at least the upper surface of the base, at least one heating element formed on portions of the thermal barrier coating, an electrically insulating layer formed on the heating element and exposed portions of the thermal barrier coating, at least one chucking electrode formed on at least a portion of the electrically insulating layer, and a protective layer formed on the chucking electrode.

24 Claims, 5 Drawing Sheets

(58) Field of Classification Search
USPC .... 219/221, 443.1, 528, 534, 538, 543, 544, 219/553
See application file for complete search history.

(56) References Cited

U.S. PATENT DOCUMENTS

| | | |
|---|---|---|
| 6,754,062 B2 | 6/2004 | Logan et al. |
| 2003/0153043 A1* | 8/2003 | Carr .................. C07K 14/3153 435/69.1 |
| 2003/0165043 A1* | 9/2003 | Logan .................... H02N 13/00 361/234 |
| 2010/0053841 A1* | 3/2010 | Rusinko, Jr. .......... H01L 21/683 361/234 |
| 2011/0092072 A1* | 4/2011 | Singh .................... C23C 14/541 438/710 |
| 2013/0344349 A1 | 12/2013 | Hugot et al. |

FOREIGN PATENT DOCUMENTS

| | | |
|---|---|---|
| RU | 2 260 071 C1 | 9/2005 |
| WO | 2012/120235 A1 | 9/2012 |

OTHER PUBLICATIONS

International Search Report and Written Opinion, International Application No. PCT/US2014/016395, dated Apr. 25, 2014 (12 pages).
Transmittal of the International Preliminary Report on Patentability, International Application No. PCT/US2014/016395, dated Jun. 19, 2015 (13 pages).

* cited by examiner

HEATED ELECTROSTATIC CHUCK AND SEMICONDUCTOR WAFER HEATER AND METHODS FOR MANUFACTURING SAME

FIELD OF THE INVENTION

The present invention relates to semiconductor wafer processing apparatus, in particular, electrostatic chucks, semiconductor wafer heaters and heated electrostatic chucks.

BACKGROUND OF THE INVENTION

Electrostatic chucks are widely used in the semi-conductor manufacturing industry in order to temporarily hold silicon wafers in place while a variety of manufacturing processes are carried out on the wafers. To this end, such electrostatic chucks include a chucking electrode to create an electrostatic force on the upper surface of the electrostatic chuck.

In order to heat the held wafers during the manufacturing process, electrostatic chucks often include one or more embedded heating elements. In addition, it is very common for the electrostatic chuck to be carried by a metal or ceramic base that includes cooling channels formed therein, with the base acting as a heat sink. Coolant flows through the channels in the base in order to help control a temperature at the upper surface of the electrostatic chuck. The base, combined with the heating element embedded in the electrostatic chuck, make it possible to raise the temperature of the wafer to a predetermined temperature, and then lower the temperature of the wafer for further processing in a very rapid cycle.

It is also known to include gas passages in the upper surfaces of the electrostatic chuck in order to provide an inert gas to the backside of the wafer, which improves heat transfer between the electrostatic chuck and the wafer.

Electrostatic chucks, such as those described above, are currently fabricated using ceramic sintering technology in which the chucking electrode and heating element are embedded within layers of ceramic powder or pre-formed ceramic sheets, and then the overall structure is co-sintered to form a unitary body. The unitary body is then attached to the base using a bonding agent.

One of the issues with such conventionally formed ceramic electrostatic chucks is that the bonding agent, such as epoxy or silicone, that is used to bond the electrostatic chuck to the base does not hold up well to the severe plasma environment in which these electrostatic chucks are used. Consequently, the outer edge of the bonding agent is eroded over time, and thus the heat transfer characteristics of the bonding agent become different between the center and peripheral portions thereof. This, in turn, affects the uniformity of heat transfer at the upper surface of the electrostatic chuck and, consequently, along the upper surface of the wafer.

Another problem with organic bonding agents such as epoxy and silicone is that they are ineffective in mitigating the differences in coefficient of thermal expansion (CTE) between the ceramic electrostatic chuck and the underlying base, which is usually made of aluminum. As such, over time, delamination tends to occur along the bonding agent layer.

While it is also known to join the ceramic electrostatic chuck to the underlying metal base by brazing, the brazed materials that are currently used are very highly electrically and thermally conductive, which results in too much heat loss from the ceramic electrostatic chuck down to the base. This increased heat loss requires a longer amount of time between wafer-handling cycles and also requires more power to be supplied to the heating element to reach the target temperature on the upper surface of the wafer.

Another problem with ceramic electrostatic chucks regardless of how they are made is that, over time, polymer materials start to deposit on the side walls of the electrostatic chuck near the upper surface. This interferes with the ability of the wafer to sit flat on the upper surface of the electrostatic chuck, which in turn causes a high leak rate of the inert gas that is supplied to the back side of the wafer for temperature control. Eventually the polymer buildup becomes so great that the electrostatic chuck needs to be either completely refurbished or simply replaced. This takes a lot of time and is very expensive.

SUMMARY OF THE INVENTION

The objective of the present invention is to overcome the aforementioned problems associated with prior art heated electrostatic chucks and semiconductor wafer heaters for semiconductor processing apparatus.

According to a first embodiment of the present invention, a heated electrostatic chuck is provided, comprising a base having an upper surface and peripheral side surfaces, a thermal barrier coating formed by plasma deposition directly on at least the upper surface of the base, at least one heating element formed on portions of the thermal barrier coating, an electrically insulating layer formed on the heating element and exposed portions of the thermal barrier coating, at least one chucking electrode formed on at least a portion of the electrically insulating layer, and a protective layer formed on the chucking electrode.

Preferably, the heating element, electrically insulating layer, chucking electrode and protective layer are all formed by plasma deposition.

According to one aspect, the thermal barrier coating is also continuously formed on the peripheral side surfaces of the base. According to one aspect, the protective layer defines the uppermost surface of the heated electrostatic chuck and extends continuously over the peripheral side surfaces of the base so as to cover the thermal barrier coating on the side surfaces of the base.

It is preferred that the thermal barrier coating is a ceramic material selected from the group consisting of yttria-stabilized zirconia, yttria, gadolinia, ceria, alumina, zirconia, and mixtures thereof. According to one aspect, the porosity of the thermal barrier coating decreases from a side adjacent the base to a side adjacent the electrically insulating layer to provide a decreasing porosity/coefficient of thermal expansion gradient with increasing distance from the base member within the thermal barrier coating layer, that is, a negative porosity/thermal expansion gradient in a thickness direction of the thermal barrier coating layer extending between the base and the electrically insulating layer.

The base preferably comprises one of a metal, ceramic and cermet, and according to one aspect, the base is a heat sink and includes cooling conduits extending therethrough. It is also preferred that the electrically insulating layer is a ceramic selected from the group consisting of alumina, yttria, fully stabilized zirconia, and zirconia toughened alumina, and that the protective layer is a ceramic selected from the group consisting of alumina, yttria, fully stabilized zirconia and zirconia toughened alumina. It is preferable that the protective layer is impervious to gas.

According to one aspect, the at least one heating element comprises another heating element provided on the thermal barrier coating on the peripheral side surfaces of the base. In this case, it is also preferred that the protective layer defines an uppermost surface of the heated electrostatic chuck and extends continuously over the peripheral side surfaces of the base so as to cover the thermal barrier coating and the heating element on the peripheral side surfaces of the base.

In order to overcome the above-described drawbacks previously associated with the provision of a bonding layer between a base member and an electrostatic chuck (ESC), heated electrostatic chuck or semiconductor wafer heater attached thereto, the present invention implements a plasma deposition technique, also referred to herein as plasma spraying, to deposit at least the thermal barrier coating (TBC) layer, but more preferably, to deposit each of the layers in the structure formed directly on the base layer. This eliminates the need for problematic bonding agents/layers which can degrade and negatively affect the thermal uniformity and processing conditions, or brazing agents which affect the thermal transfer properties and cause heat loss, as discussed above. This also greatly simplifies the overall formation process by using a single technique, rather than requiring different machinery and processes for forming multiple layers, which in turn reduces costs and improves production efficiency.

In order to further overcome the thermal mismatching issues and heat loss phenomena experienced in the prior art due to the variance among coefficients of thermal expansion (CTEs) between the respective material layers, the composition of the plasma sprayed TBC layer is selected to have the lowest possible thermal conductivity characteristics. For example, yttria-stabilized zirconia (YSZ) having a thermal conductivity of 2.3 W/mK is preferably used as the plasma spray deposited material for the TBC layer. The thermal conductivity characteristics of the TBC layer can be further reduced to about 0.8 W/mK by adjusting the orientation of cracks and pores in the plasma spray deposited TBC layer. That is, in plasma spray deposition, micro-cracks and pores exist, and the orientation of the cracks and pores are normal to the flow of heat, which reduces the thermal conductivity from 2.3 W/(mK) to about 0.8-1.7 W/(mK). In other words, the thermal conductivity can be reduced from 2.3 W/(mK) to about 0.8-1.7 W/(mK) by increasing the porosity from 2~5% to 10~15%. Techniques for increasing the porosity of the plasma deposited layer are known in the art. For example, in plasma spray deposition, variables that control the resulting porosity can be adjusted throughout the process. Factors such as the outlet velocity and the distance between the outlet and surface are adjusted throughout the deposition process, resulting in the graded porosity discussed above.

In addition, thermal mismatching is further reduced by controlling the porosity of the TBC layer. More specifically, because the base material, such as aluminum, for example, has a high CTE, a portion of the TBC layer directly adjacent the base should have a relatively high porosity to overcome the CTE mismatching issue. Since the CTE changes with porosity in plasma spray deposition, a lower porosity will yield a lower CTE, and a higher porosity will result in a higher CTE. As the distance from the interface between the base and the TBC layer increases, the porosity of the TBC layer should be reduced in order to better match up with the CTE of the insulating layer that is deposited thereon, such as an alumina insulating layer, for example. The provision of a graded thermal barrier coating (GTBC) layer in this manner therefore overcomes significant drawbacks associated with the prior art by reducing thermal conductivity, thermal mismatching and preventing bowing to ensure better thermal uniformity and improved performance characteristics.

In order to control the thickness of the heating element and ensure overall thermal uniformity, one or more heating elements according to the present invention are patterned by machining the top and/or peripheral side surfaces of the base material to define a circuitous recessed pattern, such as a coil, zigzag, spiral, whirl or sinuous pattern, for example. The gap between adjacent heating element portions on a given surface (top or side) of the base is precisely controlled in one aspect by the process of machining the pattern recess to define a predetermined distance for maintaining thermal uniformity. The GTBC layer is then deposited by plasma spraying on the patterned base material so as to fill the valleys of the pattern (i.e., the recess) and cover the plateau peaks (gaps between the valleys) defined by the pattern shape, and then the material for the heating element is deposited thereon, also preferably by plasma spraying. The ultimate pattern of the heating element is revealed by precisely grinding the surface thereof to a predetermined thickness in order to expose the GTBC layer-covered peaks of the pattern, so that the heating element is located in a position corresponding to the pattern recess valleys, and adjacent portions thereof are separated from one another via gaps comprising the exposed peaks of the GTBC layer in locations corresponding to the plateau peaks of the pattern. This grinding process makes it possible to provide a uniform thickness for the heating element within a tolerance of ±0.005 mm, which further improves the thermal uniformity.

The provision of the heating element on the peripheral side of the base prevents the buildup of polymer deposits on the side wall of the heated ESC/heater, which arise due to the etching of the heated ESC/heater environment during the semiconductor processing. The target temperature to prevent the polymer deposition during semiconductor wafer processing is 100-150° C. If left unchecked, eventually, the polymer buildup will reach a level approaching the wafer side. In that case, the polymer can undesirably attach to a portion of the wafer during wafer loading/unloading processes, and can detach, along with side portions of the device, which degrades the gas-tightness of the apparatus and causes gas leaks. In other instances, the excess polymer deposits can be burned out due to the high RF current applied to the ESC in order to attract ions to the substrate from the bulk plasma, which eventually arcs and causes permanent failure of the ESC. Prior to the present invention, the provision of such a heater on the peripheral side surfaces of a base member for these types of devices was unknown.

After the heating element is formed as described above, an electrically insulating layer is formed thereon, preferably by plasma deposition, as well. If this electrically insulating layer is to be the uppermost layer of a device intended to function as a semiconductor wafer heater, for example, rather than a heated ESC as further explained, then the electrically insulating layer constitutes a protective layer, and the surface thereof is likewise ground to control the thickness thereof to achieve the desired thermal uniformity.

For a heated ESC, the thickness of the electrically insulating layer is controlled by the deposition process, but is also preferably ground after deposition, as well. Thereafter, one or more chucking electrodes are deposited atop the electrically insulating layer, and then ground to control the thickness thereof with both thermal uniformity and uniformity of chucking force in mind. Another electrically insulating layer defining a gas-tight outer protective layer is then deposited atop the chucking electrode, again, preferably by plasma spraying, followed by a final grinding process to control the thickness of the protective layer, as described above.

The present invention also solves the aforementioned problems associated with surface renewal in that the plasma-deposited upper surface layer (i.e., protective electrically insulating layer) of the ESC or semiconductor wafer heater can be easily partially removed by grinding, and a new layer is readily reapplied by plasma deposition to the required specifications to restore the proper dimensions.

According to a second embodiment of the present invention, a support for at least one of a semiconductor wafer heater, a semiconductor wafer electrostatic chuck, and a semiconductor wafer heated electrostatic chuck is provided. The support comprises a base having an upper surface and peripheral side surfaces, wherein the upper surface is adapted to support the at least one of a semiconductor wafer heater, a semiconductor wafer electrostatic chuck, and a semiconductor wafer heated electrostatic chuck. The support also includes a heating element formed at least on portions of the peripheral side surfaces of the base, and a protective layer covering the heating element and any exposed portions of the peripheral side surfaces of the base.

Preferably, the protective layer is impervious to gas. It is also preferred that the base is a metal, and that the support further comprises an electrically insulating layer between the base and the heating element, wherein the electrically insulating layer is formed of a thermal barrier material.

Providing the peripheral side surface-located heating element overcomes the polymer build-up problems discussed above, and improves the performance longevity of conventional sintered devices (heaters, ESCs) provided in connection with the side-heated support according to the present invention.

According to a third embodiment of the present invention, a semiconductor wafer heater is provided, comprising a base having at least one continuous, circuitous recess formed in an upper surface thereof, a thermal barrier coating layer formed by plasma spraying directly on the upper surface of the base and in the recess, a heating element formed only on first portions of the thermal barrier coating that are arranged in the recess such that second portions of the thermal barrier coating that are arranged on the upper surface of the base electrically isolate adjacent portions of the heating element from one another, and an electrically insulating layer formed on the heating element and the second portions of the thermal barrier coating.

The semiconductor wafer heater according to this aspect of the present invention offers the same benefits associated with the first aspect of the present invention described above, and overcomes the drawbacks of the prior art in a similar way. The structure is the same, with the exception of the subsequently formed chucking electrode and additional insulating layer in the heated ESC described above, as one skilled in the art can appreciate. The optional provision of the peripheral side-located heating element, as described in connection with the first aspect above, offers the same benefits, as well.

The present invention also provides a method for fabricating a heated ESC, such as the one described above in connection with the first embodiment of the present invention. The method comprises the steps of:

providing a base member having an upper surface and peripheral side surfaces;

forming a recess pattern for at least one heating element on at least the upper surface of the base member;

forming a continuous thermal barrier coating layer on the upper surface and the peripheral side surfaces of the base member by plasma deposition having a decreasing porosity gradient and decreasing coefficient of thermal expansion gradient with increasing distance from the base member within the thermal barrier coating layer, that is, a negative porosity/thermal expansion gradient in a thickness direction of the thermal barrier coating layer extending between the base member and the electrically insulating layer;

forming a heating element layer on the thermal barrier coating layer at least on said upper surface by plasma deposition;

removing portions of the heating element layer by grinding to expose portions of said thermal barrier coating layer between adjacent portions of the heating element layer and to control a thickness of the heating element layer;

forming an electrically insulating layer by plasma deposition to cover the heating element layer and the thermal barrier coating layer on the upper surface of the base member;

forming an electrostatic chucking electrode on at least a portion of the electrically insulating layer by plasma deposition;

removing a portion of the electrostatic chucking layer by grinding to control the thickness thereof;

forming a protective layer, comprising an electrically insulating material, by plasma deposition, over the electrostatic chucking layer; and removing a portion of the protective layer by grinding to control the thickness thereof.

Preferably, the step of forming a recess pattern for at least one heating element further comprises forming a recess pattern for at least one heating element in the peripheral side surfaces of the base member. It is also preferred that the step of forming a continuous thermal barrier coating further comprises forming the continuous thermal barrier coating on the peripheral side surfaces of the base member by plasma deposition. In addition, the step of forming a protective layer further comprises forming the protective layer to cover the thermal barrier coating and the heating element on the peripheral side surfaces of the base member.

The present invention also provides a method for fabricating a support for at least one of a semiconductor wafer heater, a semiconductor electrostatic chuck, and a semiconductor wafer heated electrostatic chuck, such as the support according to the second embodiment described above. The method comprises the steps of:

providing a base member having an upper surface and peripheral side surfaces;

forming a recessed pattern for at least one heating element on at least the peripheral side surfaces of the base member;

forming a heating element layer on said peripheral side surfaces of the base member;

removing portions of said heating element layer to expose portions of the base member between adjacent portions of said heating element layer, so that the heating element is located in positions corresponding to the recessed portions of the recess pattern and to control an overall thickness of the heating element; and forming a protective layer, comprising an electrically insulating, gas-tight material, by plasma deposition, over the heating element any exposed portions of the peripheral side surfaces of the base member.

Preferably, the method further comprises a step of forming a continuous thermal barrier coating layer by plasma deposition on the peripheral side surfaces of the base member by plasma deposition after the pattern forming step but before the heating element formation step, wherein the protective layer covers the heating element and any exposed portions of the thermal barrier coating on the peripheral side surfaces of the base member.

The present invention also provides a method for fabricating a ceramic heater, such as the semiconductor wafer heater according to the third embodiment described above. The method comprises the steps of:

providing a base member having an upper surface and peripheral side surfaces;

forming a recess pattern for at least one heating element on at least the upper surface of the base member;

forming a continuous thermal barrier coating layer on at least the upper surface of the base member by plasma deposition;

forming a heating element layer on said thermal barrier coating layer at least on the upper surface by plasma deposition;

removing portions of the heating element layer to expose portions of the thermal barrier coating layer between adjacent portions of the heating element layer and to control a thickness of the heating element layer;

forming a protective layer, comprising an electrically insulating material, by plasma deposition, over thermal barrier coating layer and the heating element on at least the upper surface of the base member, and removing a portion of the protective layer by grinding to control the thickness thereof.

Preferably, the step of forming a recess pattern for at least one heating element further comprises forming a recess pattern for at least one heating element on the peripheral side surfaces of the base member. It is also preferred that the step of forming a continuous thermal barrier coating further comprises forming the continuous thermal barrier coating on the recess pattern on the peripheral side surfaces of the base member by plasma deposition. Moreover, it is preferred that the step of forming a protective layer further comprises forming the protective layer to cover the thermal barrier coating and the heating element on the peripheral side surfaces of the base member.

BRIEF DESCRIPTION OF THE DRAWINGS

The present invention is described in detail herein below in connection with the associated drawing figures, in which.

DETAILED DESCRIPTION OF THE INVENTION

Figure 1:
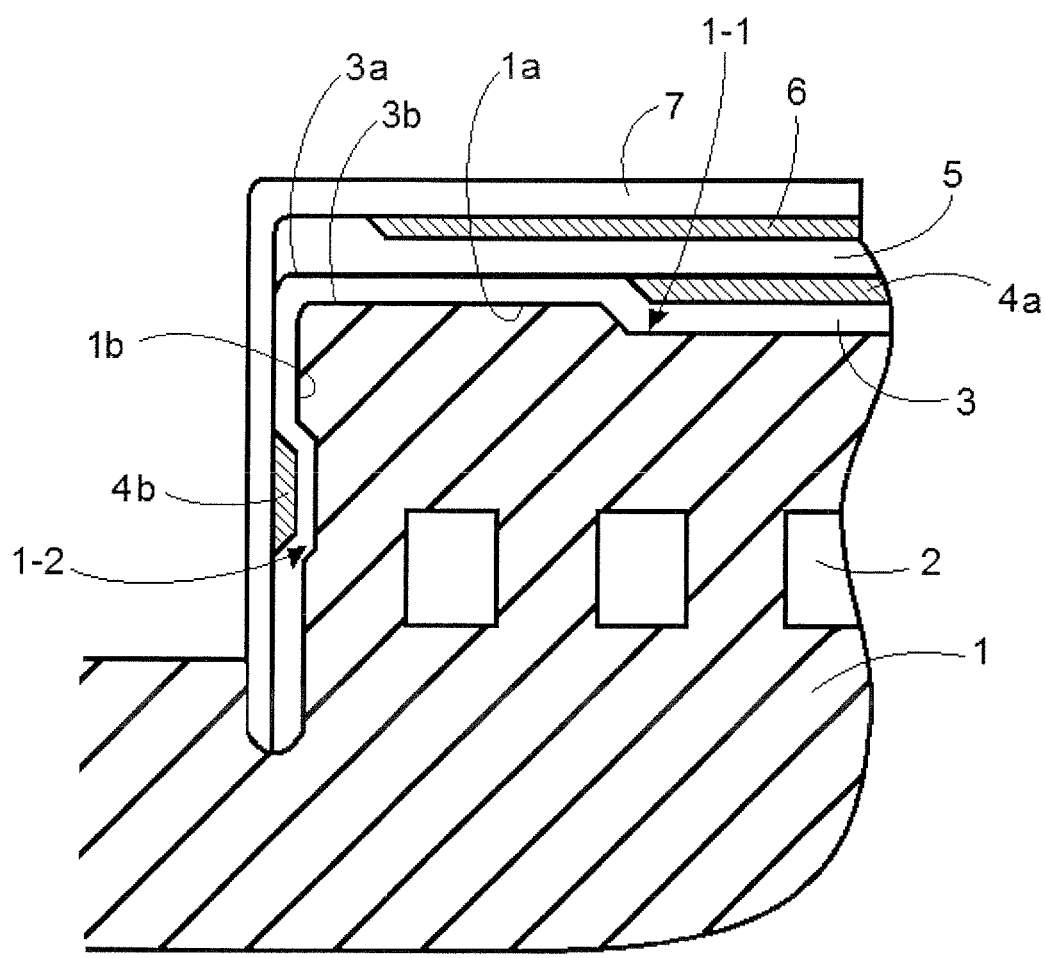
FIG. 1 is a cross-sectional view of a heated electrostatic chuck according to one aspect of the present invention.

FIG. 1 is a cross-sectional view of a semiconductor wafer heated electrostatic chuck (ESC) according to one aspect of the present invention. The heated ESC 10 includes a base 1 having cooling channels 2 (i.e., coolant conduits) provided therein when the base is a metal, for example. The base material can be made of a metal, a ceramic or a composite material such as a ceramic material, including, but not limited to aluminum or alumina, for example. Preferably, the coefficient of thermal expansion coefficient (CTE) of the material comprising the base 1 is in a range of 20 to 30 µm/m° C. at 25° C.-227° C., which corresponds to an operating temperature range of the ESC, and is most preferably around 25.2 µm/m° C. This preferred CTE value corresponds to the CTE of a particular aluminum base used by the Applicant, FM Industries. The preferred CTE range is about ±5 µm/m° C. of the CTE of this base material. If the CTE is outside the preferred range, movement due to thermal expansion can affect performance, which should be avoided. In addition, it is preferred that the thermal conductivity of the material comprising the base 1 is at least 100 W/mK at 25° C.-227° C., preferably no less than 160 W/mK. If the thermal conductivity is outside this range, poor thermal uniformity (U %) will be achieved.

Figure 5:
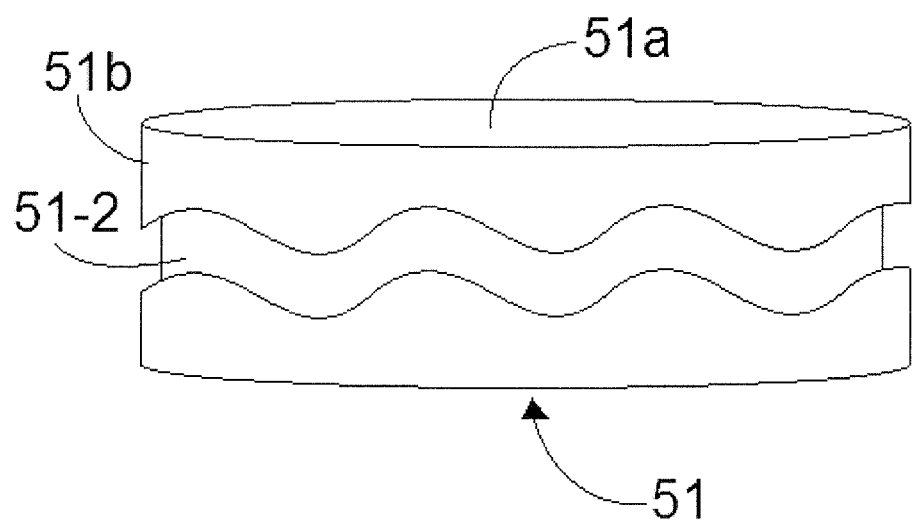
FIG. 5 is a perspective view showing a base member having a pattern formed on the peripheral side surface thereof, before a pattern is formed on the upper surface thereof.

A continuous recessed pattern 1-1 is formed, preferably by machining, on at least the upper surface 1a of the base 1 (see also FIG. 3A, discussed below), and, as shown, a recessed pattern 1-2 is likewise formed on the peripheral side surface 1b of the base 1 (see also pattern 51-2 in FIG. 5). The pattern 1-1 is preferably a circuitous pattern, such as a spiral or whirl, for example, and the pattern 1-2 is preferably a sinuous pattern, as shown in FIG. 5, but could also be a zigzag pattern, for example. The exact shape of the patterns 1-1 and 1-2 are not limited to the specific examples herein, and any suitable pattern shape may be used that is consistent with the requirements of the present invention. The patterns can be formed by any suitable formation method. Preferably, a computer numerical control (CNC) milling machine is used in order to precisely control the dimensions of the recessed pattern.

When the base 1 is a metal, such as aluminum, for example, it is necessary to provide electrical and thermal insulation between the heating element portions 4a and/or 4b and the base 1 to ensure proper electrical performance and to control the directionality of the heat generated (i.e., to prevent the base 1 from acting as a complete heat-sink). To that end, a continuous thermal barrier coating (TBC) layer 3 (also referred to as a graded thermal barrier coating layer, GTBC layer 3) is formed on the patterned upper surface 1a of the base 1, as well as the patterned peripheral side surface 1b of the base 1, preferably by plasma spraying. The TBC layer 3 covers the peaks and resides in the valleys or recesses delineated by the respective patterns 1-1 and 1-2 on the upper surface 1a and peripheral side surface 1b of the base 1.

The TBC layer 3 is preferably made of a ceramic such as yttria-stabilized zirconia (YSZ). Other examples of materials that are suitable for the TBC layer 3 include, but are not limited to, zirconia, alumina, yttria, ceria, gadolinia, and mixtures thereof. Preferably, the thickness of the TBC layer 3 is controlled by the plasma deposition technique to be in a range of 6 mils to 14 mils, and is preferably about 10 mils. When the thickness of the TBC layer 3 is outside this range, there can be an increase in heat-up and cool-down times, and decreased thermal uniformity (U %). The CTE of the TBC layer 3 is 5 to 25 µm/m° C. at 25° C.-227° C., most preferably about 7-15 µm/m° C. at 20° C. If the CTE is outside the above range, movement due to thermal expansion negatively affects performance. Further, it is preferred that the thermal conductivity of the TBC layer 3 is in a range of 0.3 to 2.8 W/mK at 25° C.-227° C., preferably no more than 0.8 W/mK at 20° C. If the thermal conductivity exceeds this range, then the desired pre-heat temperatures cannot be achieved without using an unreasonable power input. If the thermal conductivity is lower than 0.3 W/mK, then there is an undesirable increase in heat-up and cool-down times.

In addition to controlling the above noted characteristics of the TBC layer 3, it is also important to control the porosity of the TBC layer 3 in order to provide a porosity gradient (i.e., a graded thermal barrier coating layer, GTBC), where the porosity of the GTBC layer 3 decreases in the thickness direction from the inner surface 3b adjacent to the base 1 toward the outer surface 3a thereof.

After the TBC layer 3/GTBC layer 3 is formed, a heating element layer is formed on top of the GTBC layer 3 to define the heating element portions 4a and 4b. The heating element layer is preferably formed by plasma spray deposition. Suitable materials for the heating element layer include tungsten (W), tungsten carbide (WC), molybdenum (Mo) and nickel (Ni) but are not limited to these examples. Preferably, the heating element layer is at least one of W and Mo, and more preferably WC.

The thickness of the heating element layer is in a range of 6-10 mils, and is preferably about 6 mils. The ultimate thickness of the heating element portions 4a and 4b is controlled to within a tolerance ±0.005 mm by the grinding process described below. If the thickness of the heating element layer exceeds this range, there can be an undesirable increase in heat-up and cool-down times, and decreased thermal uniformity. If the thickness of the heating element portions 4a, 4b is less than 6 mils, then the manufacturing tolerance of ±0.005 mm has too great of an effect on the performance or the thermal uniformity of the heating element. The CTE of the heating element portions 4a, 4b is 3 to 10 μm/m° C. at 25° C.-227° C., preferably about 5 μm/m° C. at 20-100° C. If the CTE is outside this range, then delamination between the heating element and the TBC or the insulating layer can occur. Further, it is preferred that the thermal conductivity of the heating element portions 4a, 4b is at least 100 W/mK at 25° C.-227° C., more preferably at least 163 W/mK at 20° C. If the thermal conductivity is not at least 100 W/mK, the desired thermal uniformity (U %) will not be achieved.

In the embodiment shown in FIG. 1, and as described below in connection with FIG. 3C, the heating element layer is initially formed as a continuous layer which covers the GTBC layer 3 on the upper surface 1a and peripheral side surface 1b of the base 1. This is easily achieved by plasma spraying, as one skilled in the art can appreciate. After the formation of the heating element layer, the surface of the assembly is machined (ground) to precisely control the thickness of the heating element layer and to expose portions of the patterns 1-1 and 1-2 corresponding to peak positions of the recessed patterns, and to remove portions of the heating element layer to define the heating element portions 4a and 4b. In that manner, the heating element portion 4a is located in positions corresponding to the valleys of the pattern 1-1 (see also FIG. 3D), and the heating element portion 4b is located in positions corresponding to the valleys of the pattern 1-2. Adjacent portions of the heating element 4a are separated from one another by the pattern portions (corresponding to the plateau peaks) defined by the insulating GTBC layer 3 on the upper surface 1a of the base 1, and adjacent portions of the heating element 4b on the peripheral side surface 1b of the base 1 are likewise isolated from one another by the pattern peak position of the TBC layer 3 (see, e.g., FIG. 4).

A continuous electrically insulating layer 5 is then formed over the heating element portions 4a and the exposed portions of the GTBC layer 3 on the upper surface 1a of the base 1. The electrically insulating layer 5 is preferably formed by plasma spraying. The electrically insulating layer 5 may extend over the edge of the upper surface 1a of the base 1 onto a portion of the peripheral side surface 1b to some extent, as illustrated in FIG. 1, but does not cover the GTBC layer 3 and heating element portion 4b on the peripheral side surface 1b of the base 1. The electrically insulating layer 5 is preferably alumina ($Al_2O_3$) or other ceramic composites such as yttria ($Y_2O_3$), fully stabilized zirconia ($ZrO_2$), or zirconia toughened alumina, for example.

The thickness of the electrically insulating layer 5 is in a range of 8-14 mils, and preferably about 9 mils. If the thickness of the electrically insulating layer 5 exceeds this range, there is an undesirable increase in heat-up and cool-down times, and thermal uniformity is decreased. If the thickness of the electrically insulating layer 5 is less than 8 mils, then break down between the electrode and heating element can occur. The CTE of the electrically insulating layer 5 is about 5-8 μm/m° C. at 25° C.-227° C. If the CTE outside this range then movement due to thermal expansion undesirably affects performance. Further, it is preferred that the thermal conductivity of the electrically insulating layer 5 is in a range of 24-46 W/mK at 25° C.-227° C.

In the embodiment shown in FIG. 1, this electrically insulating layer 5 constitutes a middle insulating layer. In the embodiment shown in FIGS. 3E and 4, for example, the corresponding electrically insulating layer 35 instead constitutes an uppermost electrically insulating layer (i.e., a protective layer).

Referring back to FIG. 1, a chucking electrode 6 is then formed on the electrically insulating layer 5, again, preferably by plasma spraying. The chucking electrode 6 is preferably made of a conductive ceramic, examples of which include, but are not limited to, tungsten (W) and tungsten carbide (WC) for example. Preferably, the chucking electrode 6 is made of titania doped alumina.

The thickness of the chucking electrode 6, which is controlled via a combination of deposition and subsequent grinding, is in a range of 1 to 8, and is preferably about 2 mils. If the thickness of the chucking electrode 6 is above this range, then there is an undesirable increase in heat-up and cool-down times, and if the thickness is below this range, then the manufacturing tolerance becomes too large to ensure functionality. The CTE of the chucking electrode 6 is about 5-8 μm/m° C. at 25° C.-227° C. If the CTE is outside the above range, movement due to thermal expansion negatively affects performance. Further, it is preferred that the thermal conductivity of the chucking electrode 6 is at least 24 W/mK at 25° C.-227° C. If the thermal conductivity is below this, the desired thermal uniformity cannot be achieved.

Finally, a protective layer 7, defining an outermost electrically insulating layer, which is impervious to gas, is formed continuously, preferably by plasma spraying, to cover the heating element portion 4b and the GTBC layer 3 on the peripheral side surface 1b of the base 1, as well as the electrically insulating layer 5 and the chucking electrode 6 on the upper surface 1a of the base 1. The protective layer 7 is preferably made of alumina ($Al_2O_3$) or other ceramic compositions such as yttria ($Y_2O_3$), fully stabilized zirconia ($ZrO_2$), or zirconia toughened alumina, for example.

The thickness of the protective layer 7 is controlled via a combination of deposition and subsequent grinding to be in a range of 0.6-10 mils, and is preferably about 7 mils. If the thickness of the protective layer 7 is outside this range, the desired chucking force cannot be obtained (i.e., there is a decrease in chucking force). The CTE of the protective layer 7 is preferably about 5-8 μm/m° C. at 25° C.-227° C. Further, it is preferred that the thermal conductivity of the protective layer 7 is at least 24 W/mK at 25° C.-227° C. in order to ensure that thermal uniformity is achieved.

Figure 2:
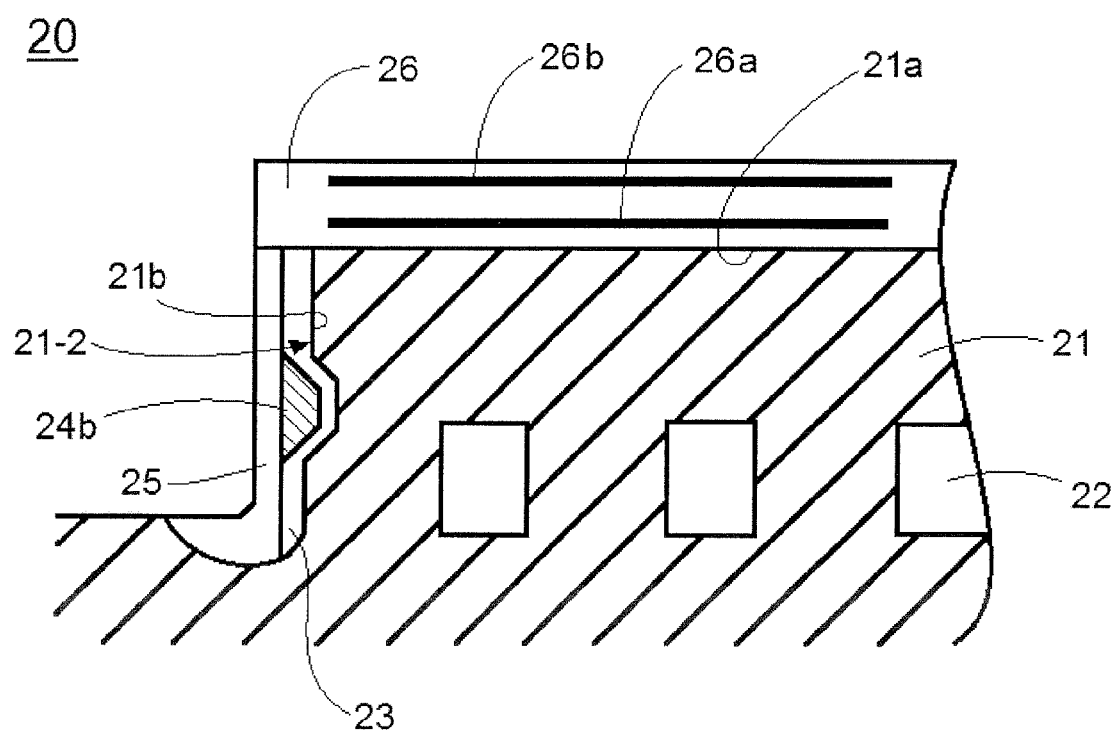
FIG. 2 is a cross-sectional view of a heated ESC according to another aspect of the present invention.

FIG. 2 is a cross-sectional view of a support 20 for at least one of a semiconductor wafer heater, a semiconductor wafer electrostatic chuck, and a semiconductor wafer heated electrostatic chuck according to another embodiment of the present invention. In this case, the support 20 is shown to support a conventional pre-sintered heated ESC 26, including a heating element 26a and a chucking electrode 26b embedded therein. Repeat descriptions of elements corresponding to those discussed above are omitted. When the base 21 is a metal, the support 20 includes cooling channels 22, a TBC layer 23 (or GTBC layer 23) interposed between the peripheral side surface 21b of the base 21 and a heating element portion 24b formed thereon in the same manner discussed above in connection with FIG. 1 (see also FIG. 5). An electrically insulating layer 25 (i.e., protective layer) is provided on the peripheral side surface 21b of the base 21 to cover the exposed portions of the TBC layer 23 and the heating element portion 24b or if the base is not metal and no TBC layer is provided, to cover the heating element portion 24b and any exposed portions of the peripheral side surface 21b of the base 21.

In this embodiment, while the upper surface 21a of the base 21 is not machined to form a pattern for a heating element, the peripheral side surface 21b of the base 21 are provided with a recessed pattern 21-2, such as the sinuous pattern 51-2 shown in FIG. 5, for example. The TBC layer 23 is formed, preferably by plasma spraying, on at least the peripheral side surface 21b of the base 21, as described above in connection with FIG. 1. A heating element layer is formed thereon, preferably by plasma spraying, as described above in connection with FIG. 1. Portions of the heating element layer are then removed to define the heating element portion 24b in locations that correspond to the recesses or grooves of the pattern 21-2, so that adjacent portions of the heating element portion 24b are separated from one another by portions of the TBC layer 23 (or the base 21 material, if the base 21 is not a metal) in locations corresponding to the peaks of the pattern, as described above in connection with FIG. 1. The protective layer 25, which is gas-tight and electrically insulating, is then provided, preferably by plasma spraying, to cover the peripheral side surface 21b of the base 21, including the heating element portion 24b, the TBC layer 23 (if provided) or any exposed portions of the peripheral side surface 21b. A conventional pre-sintered, heated ESC 26 is then adhered to the upper surface 21a of the base 21, and arranged to cover uppermost portions of the TBC layers at the upper peripheral edge of the base 21.

Figure 3:
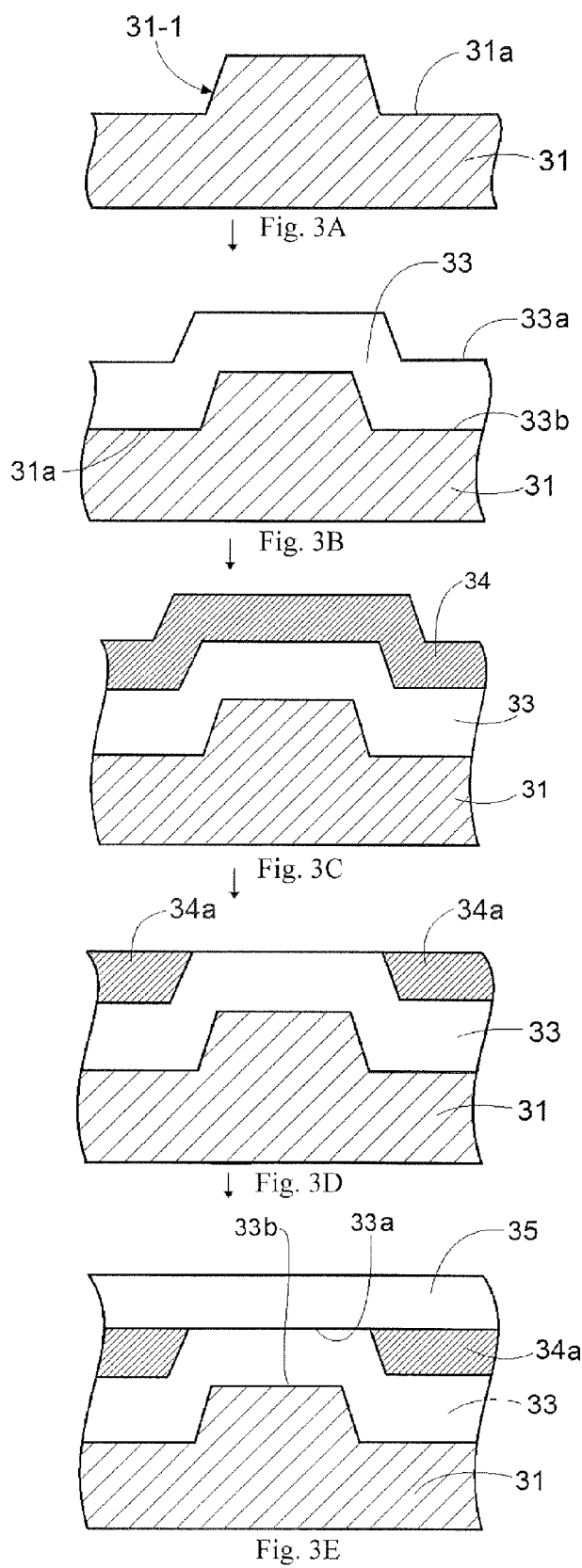
FIGS. 3A-3E are cross-sectional views showing a portion of a semiconductor wafer heater according to another aspect of the present invention, illustrating the various production steps associated therewith.
Figure 4:
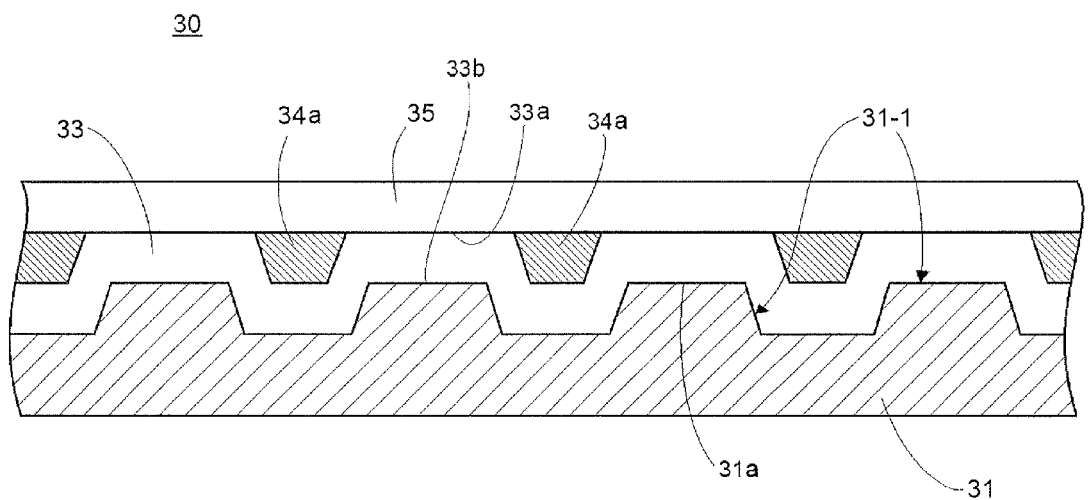
FIG. 4 is a cross-sectional view showing an expanded portion of the semiconductor wafer heater according to FIGS. 3A-3E.

FIGS. 3A-3E are cross-sectional views showing a portion of a semiconductor wafer heater according to another aspect of the present invention, illustrating the various production steps associated therewith, and FIG. 4 is a cross-sectional view showing an expanded portion of the semiconductor wafer heater according to FIGS. 3A-3E. As noted above, the same production steps, along with some additional steps, are also utilized in connection with the embodiment shown in FIG. 1, and repeat descriptions of like elements are omitted.

FIG. 3A shows a base 31 having an upper surface 31a that has been machined to define a circuitous pattern 31-1 including a plurality of peaks and valleys when viewed in cross-section (see, e.g., FIG. 4). FIG. 3B illustrates the plasma deposition of the continuous TBC layer 33 (or GTBC layer) on the upper surface 31a of the base 31, which is needed when the base is a metal, for example. FIG. 3C shows the plasma deposition of another layer to define the heating element layer 34 atop the TBC layer 33, portions of which are then removed to provide the structure shown in FIG. 3D. In connection with FIG. 4, it can be seen that the adjacent portions of the heating element portion 34a are separated from one another by portions of the TBC layer 33 corresponding to remaining peaks of the circuitous pattern 31-1. Thereafter, as shown in FIG. 3E, a continuous, gas-tight, electrically insulating layer 35 is deposited thereon by plasma spray deposition, and then the surface of that layer is machined (ground) to control the desired thickness thereof, if needed. Preferably, the thickness is controlled via grinding.

As discussed above in connection with FIGS. 1 and 2, for example, FIG. 5 is a perspective view showing a base 51 having a recessed pattern 51-2 formed on the peripheral side surface 51b thereof. Such a patterned base can be further machined (i.e., the upper surface 51a thereof) and used in connection with the embodiment shown in FIG. 1, or can be used as shown, without any pattern formation on the upper surface 51a, in the embodiment shown in FIG. 2, for example.

While the present invention has been particularly shown and described with reference to the preferred mode as illustrated in the drawings, it will be understood by one skilled in the art that various changes in detail may be effected therein without departing from the spirit and scope of the invention as defined by the claims.

What is claimed is:

1. A heated electrostatic chuck comprising:
   a base having an upper surface and peripheral side surfaces;
   a thermal barrier coating formed by plasma deposition directly on at least the upper surface of the base;
   at least one heating element formed directly on portions of the thermal barrier coating;
   an electrically insulating layer formed on the heating element and exposed portions of the thermal barrier coating;
   at least one chucking electrode formed on at least a portion of the electrically insulating layer; and
   a protective layer formed on the chucking electrode;
   wherein the thermal barrier coating is a ceramic material selected from the group consisting of yttria-stabilized zirconia, alumina, zirconia, ceria, gadolinia, yttria, and mixtures thereof; and
   wherein a porosity of the thermal barrier coating decreases from a side adjacent the base toward a side adjacent the electrically insulating layer to provide a decreasing porosity gradient and decreasing coefficient of thermal expansion gradient with increasing distance from the base member within the thermal barrier coating.

2. The heated electrostatic chuck of claim 1, wherein the heating element, electrically insulating layer, chucking electrode and protective layer are all formed by plasma deposition.

3. The heated electrostatic chuck of claim 1, wherein the thermal barrier coating is also continuously formed on the peripheral side surfaces of the base.

4. The heated electrostatic chuck of claim 3, wherein the protective layer defines the uppermost surface of the heated electrostatic chuck and extends continuously over the peripheral side surfaces of the base so as to cover the thermal barrier coating on the side surfaces of the base.

5. The heated electrostatic chuck of claim 1, wherein the base comprises one of a metal, ceramic and cermet.

6. The heated electrostatic chuck of claim 5, wherein the base is a heat sink and includes cooling conduits extending therethrough.

7. The heated electrostatic chuck of claim 1, wherein the electrically insulating layer is a ceramic selected from the group consisting of alumina, yttria, fully stabilized zirconia and zirconia toughened alumina.

8. The heated electrostatic chuck of claim 1, wherein the protective layer is a ceramic selected from the group consisting of alumina, yttria, fully stabilized zirconia and zirconia toughened alumina.

9. The heated electrostatic chuck of claim 1, wherein the protective layer is impervious to gas.

10. The heated electrostatic chuck of claim 3, wherein the at least one heating element comprises another heating element provided on the thermal barrier coating on the peripheral side surfaces of the base.

11. The heated electrostatic chuck of claim 10, wherein the protective layer defines an uppermost surface of the heated electrostatic chuck and extends continuously over the peripheral side surfaces of the base so as to cover the thermal barrier coating and the heating element on the peripheral side surfaces of the base.

12. A support for at least one of a semiconductor wafer heater, a semiconductor wafer electrostatic chuck, and a semiconductor wafer heated electrostatic chuck, the support comprising:
  a metal base having an upper surface and peripheral side surfaces, the upper surface being adapted to support the at least one of a semiconductor wafer heater, a semiconductor wafer electrostatic chuck, and a semiconductor wafer heated electrostatic chuck;
  a heating element formed at least on portions of the outermost vertical peripheral side surfaces of the metal base;
  an electrically insulating layer between the metal base and the heating element; and
  a protective layer covering the heating element and any exposed portions of the peripheral side surfaces of the metal base.

13. The support of claim 12, wherein the protective layer is impervious to gas.

14. The heated electrostatic chuck of claim 12, wherein the electrically insulating layer is formed of a thermal barrier material.

15. A semiconductor wafer heater comprising:
  a base having at least one continuous, circuitous recess formed in an upper surface thereof;
  a thermal barrier coating layer formed by plasma spraying directly on the upper surface of the base and in the recess;
  a heating element formed directly and only on first portions of the thermal barrier coating layer that are arranged in the recess such that second portions of the thermal barrier coating layer that are arranged on the upper surface of the base electrically isolate adjacent portions of the heating element from one another; and
  an electrically insulating layer formed on the heating element and the second portions of the thermal barrier coating layer;
  wherein the thermal barrier coating layer is a ceramic material select from the group consisting of yttria-stabilized zirconia, alumina, zirconia, cerin, gadolinia, yttria, and mixtures thereof; and
  wherein a porosity of the thermal barrier layer coating decreases from a side adjacent the base toward a side adjacent the electrically insulating layer to provide a decreasing porosity gradient and decreasing coefficient of thermal expansion gradient with increasing distance from the base member within the thermal barrier coating layer.

16. A method of manufacturing a heated electrostatic chuck, the method comprising the steps of:
  providing a base member having an upper surface and peripheral side surfaces;
  forming a recess pattern for at least one heating element on at least the upper surface of the base member;
  forming a continuous thermal barrier coating layer on the upper surface and the peripheral side surfaces of the base member by plasma deposition having a decreasing porosity gradient and decreasing coefficient of thermal expansion gradient with increasing distance from the base member within the thermal barrier coating layer in a thickness direction of the thermal barrier coating layer;
  forming a heating element layer directly on the thermal barrier coating layer at least on said upper surface by plasma deposition;
  removing portions of the heating element layer by grinding to expose portions of said thermal barrier coating layer between adjacent portions of the heating element layer and to control a thickness of the heating element layer;
  forming an electrically insulating layer by plasma deposition to cover the heating element layer and the thermal barrier coating layer on the upper surface of the base member;
  forming an electrostatic chucking electrode on at least a portion of the electrically insulating layer by plasma deposition;
  removing a portion of the electrostatic chucking layer by grinding to control the thickness thereof;
  forming a protective layer, comprising an electrically insulating material, by plasma deposition, over the electrostatic chucking layer; and
  removing a portion of the protective layer by grinding to control the thickness thereof.

17. The method according to claim 16, wherein said step of forming a recess pattern for at least one heating element further comprises forming a recess pattern for at least one heating element in the peripheral side surfaces of the base member.

18. The method according to claim 17, wherein said step of forming a continuous thermal barrier coating layer further comprises forming the continuous thermal barrier coating layer on the peripheral side surfaces of the base member by plasma deposition.

19. The method according to claim 18, wherein said step of forming a protective layer further comprises forming the protective layer to cover the thermal barrier coating layer and the heating element on the peripheral side surfaces of the base member.

20. A method of manufacturing a semiconductor wafer heater, the method comprising the steps of:
  providing a base member having an upper surface and peripheral side surfaces;
  forming a recess pattern for at least one heating element on at least the upper surface of the base member;

forming a continuous thermal barrier coating layer on at least the upper surface of the base member by plasma deposition;

forming a heating element layer directly on said thermal barrier coating layer at least on the upper surface by plasma deposition;

removing portions of the heating element layer to expose portions of the thermal barrier coating layer between adjacent portions of the heating element layer and to control a thickness of the heating element layer;

forming a protective layer, comprising an electrically insulating material, by plasma deposition, over thermal barrier coating layer and the heating element on at least the upper surface of the base member; and removing a portion of the protective layer by grinding to control the thickness thereof;

wherein the thermal barrier coating layer is a ceramic material selected from the group consisting of yttria-stabilized zirconia, alumina, zirconia, ceria, gadolinia, yttria, and mixtures thereof; and wherein a porosity of the thermal barrier coating layer decreases from a side adjacent the base member toward a side adjacent the protective layer to provide a decreasing porosity gradient and decreasing coefficient of thermal expansion gradient with increasing distance from the base member within the thermal barrier coating layer.

21. The method according to claim 20, wherein said step of forming a recess pattern for at least one heating element further comprises forming a recess pattern for at least one heating element on the peripheral side surfaces of the base member.

22. The method according to claim 21, wherein said step of forming a continuous thermal barrier coating layer further comprises forming the continuous thermal barrier coating layer on the recess pattern on the peripheral side surfaces of the base member by plasma deposition.

23. The method according to claim 22, wherein said step of forming a protective layer further comprises forming the protective layer to cover the thermal barrier coating layer and the heating element on the peripheral side surfaces of the base member.

24. A method for manufacturing a support for at least one of a semiconductor wafer heater, a semiconductor wafer electrostatic chuck, and a semiconductor wafer heated electrostatic chuck, the method comprising the steps of:

providing a base member having an upper surface and peripheral side surfaces;

forming a recessed pattern for at least one heating element on at least the peripheral side surfaces of the base member;

forming a continuous thermal barrier coating layer by plasma deposition on the peripheral side surfaces of the base member by plasma deposition;

forming a heating element layer directly on said thermal barrier coating layer on said peripheral side surfaces of the base member;

removing portions of said heating element layer to expose portions of the base member between adjacent portions of said heating element layer, so that the heating element is located in positions corresponding to the recessed portions of the recess pattern and to control an overall thickness of the heating element; and forming a protective layer, comprising an electrically insulating, gas-tight material, by plasma deposition, over the heating element any exposed portions of the peripheral side surfaces of the base member;

wherein the protective layer covers the heating element and any exposed portions of the thermal barrier coating layer on the peripheral side surfaces of the base member;

wherein the thermal barrier coating layer is a ceramic material selected from the group consisting of yttria-stabilized zirconia, alumina, zirconia, ceria, gadolinia, yttria, and mixtures thereof; and wherein a porosity of the thermal barrier coating layer decreases from a side adjacent the base member toward a side adjacent the protective layer to provide a decreasing porosity gradient and decreasing coefficient of thermal expansion gradient with increasing distance from the base member within the thermal barrier coating layer.

* * * * *